United States Patent
Meeker

(10) Patent No.: US 6,692,132 B1
(45) Date of Patent: Feb. 17, 2004

(54) FACEPLATE WITH INTEGRATED LIGHT-PIPE

(75) Inventor: Matthew K. Meeker, Santa Rose, CA (US)

(73) Assignee: Calix Networks, Inc., Petaluma, CA (US)

(*) Notice: Subject to any disclaimer, the term of this patent is extended or adjusted under 35 U.S.C. 154(b) by 0 days.

(21) Appl. No.: 10/080,811

(22) Filed: Feb. 21, 2002

(51) Int. Cl.[7] .................................................. G01D 11/28
(52) U.S. Cl. ......................... 362/26; 362/24; 362/31; 362/85; 362/88; 362/551; 362/558; 362/27; 385/33; 385/901
(58) Field of Search .............................. 362/24, 25, 26, 362/27, 85, 88, 551, 558; 385/33, 901

(56) References Cited

U.S. PATENT DOCUMENTS 5,053,928 A * 10/1991 Pasco ........................... 362/24
5,083,240 A * 1/1992 Pasco ........................... 362/26
5,130,897 A * 7/1992 Kuzma ......................... 362/24

* cited by examiner

Primary Examiner—Alan Cariaso
Assistant Examiner—James W Cranson, Jr.
(74) Attorney, Agent, or Firm—Silicon Valley Patent Group LLP

(57) ABSTRACT

A faceplate (indicating operation status of an apparatus) includes a bezel and a light-pipe, which are integrated into a piece. The faceplate can be injection-molded with an optically clear plastic. The light-pipe includes a lens and a light guide. The lens focuses light from a light source toward the light guide and is shaped so as to focus and collect the light within a boundary of the light guide. The surface of the light guide includes a number of mini refracting lenses to promote illumination of the light. Alternatively, an ink can be applied on the surface of the light guide to promote the illumination of the light. Further, a diffusing lens can be formed on the surface of the light guide to promote illumination of the, light. The faceplate can include multiple light-pipes.

8 Claims, 3 Drawing Sheets

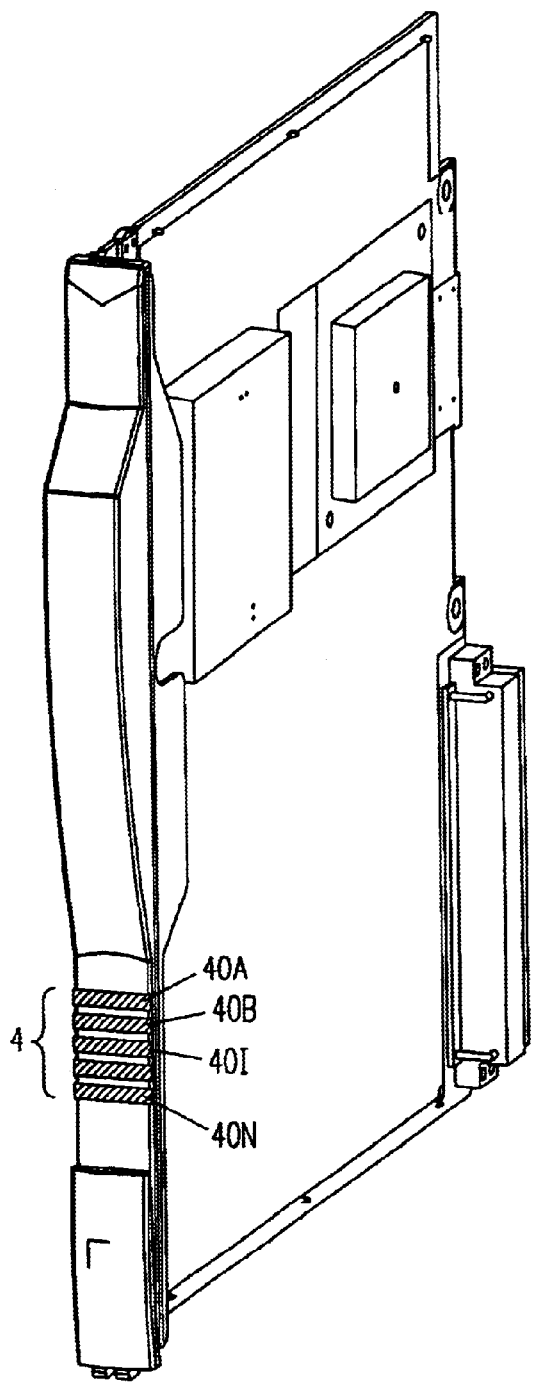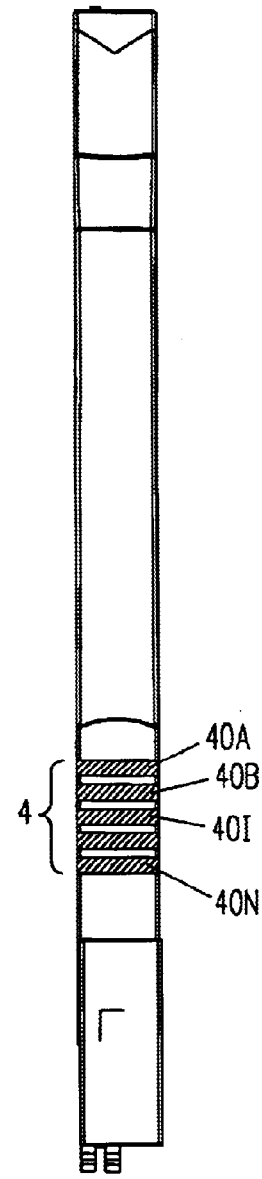
FIG. 5A
FIG. 5B

FACEPLATE WITH INTEGRATED LIGHT-PIPE

FIELD OF THE INVENTION

The present invention relates to a faceplate having one or more light pipes integrated therein.

BACKGROUND

Light pipes are commonly used in telecommunication equipment to allow by their illuminated and/or colored status the operator or end user to recognize the operation conditions such as power on-off, standby mode, synchronization of multiple fiber rings, malfunctioning of the equipment, and in-use of particular circuits. In conventional telecommunication equipment, a light emitting diode (LED) is mounted on a printed circuit board, and the LED-emitted light is displayed through a light pipe on a faceplate of the equipment to convey status information to a user. In particular, light pipes having parallel light-transmitting capability are useful for displaying a row or a column of lights.

However, the conventional telecommunication equipment usually requires the assembly of the light pipes into the holes formed through the faceplate (also called "bezel"). This assembly and the aligning of the printed circuit board having the LEDs may be difficult and costly. In addition, conventional assemblies of light pipes, faceplates, and printed circuit boards are difficult to dismantle for servicing. Thus, Applicant has found a need for a cost-effective and easily serviceable faceplate including the light pipes.

SUMMARY

In accordance with an embodiment of the present invention, an integrated faceplate (for indicating operation status of an apparatus) includes a bezel (also called "frame") and a light-pipe, which are both integrated into a single piece. The integrated faceplate can be injection-molded with an optically clear plastic, or can be cast in case of an acrylic. The integrated faceplate can include one or more light-pipes integrated with the frame, depending on the number of signals to be displayed by the faceplate.

In one embodiment, the light-pipe itself includes two parts: a lens and a light guide, both of which are also integrated into the above-described single piece. The lens focuses light from a light source toward the light guide and the lens is shaped so as to diffuse the light within a boundary of the light guide. The surface of the light guide includes a number of lenses (also called "mini refracting lenses" or "diffusion lenses") to promote illumination by the light incident on the light guide from the lens.

Alternatively, an ink can be applied on the surface of the light guide to promote the illumination by the incident light. Further, a diffusing lens can be formed on the surface of the light guide to promote illumination by the incident light.

BRIEF DESCRIPTION OF THE DRAWINGS

FIGS. 5A and 5B illustrate, in a perspective view and a front elevation view respectively, multiple region of one embodiment of the integrated faceplate that are lit during operation by light pipes of the type described herein.

Use of the same reference symbols in different drawings indicates similar or identical items.

DETAILED DESCRIPTION

Figure 1:
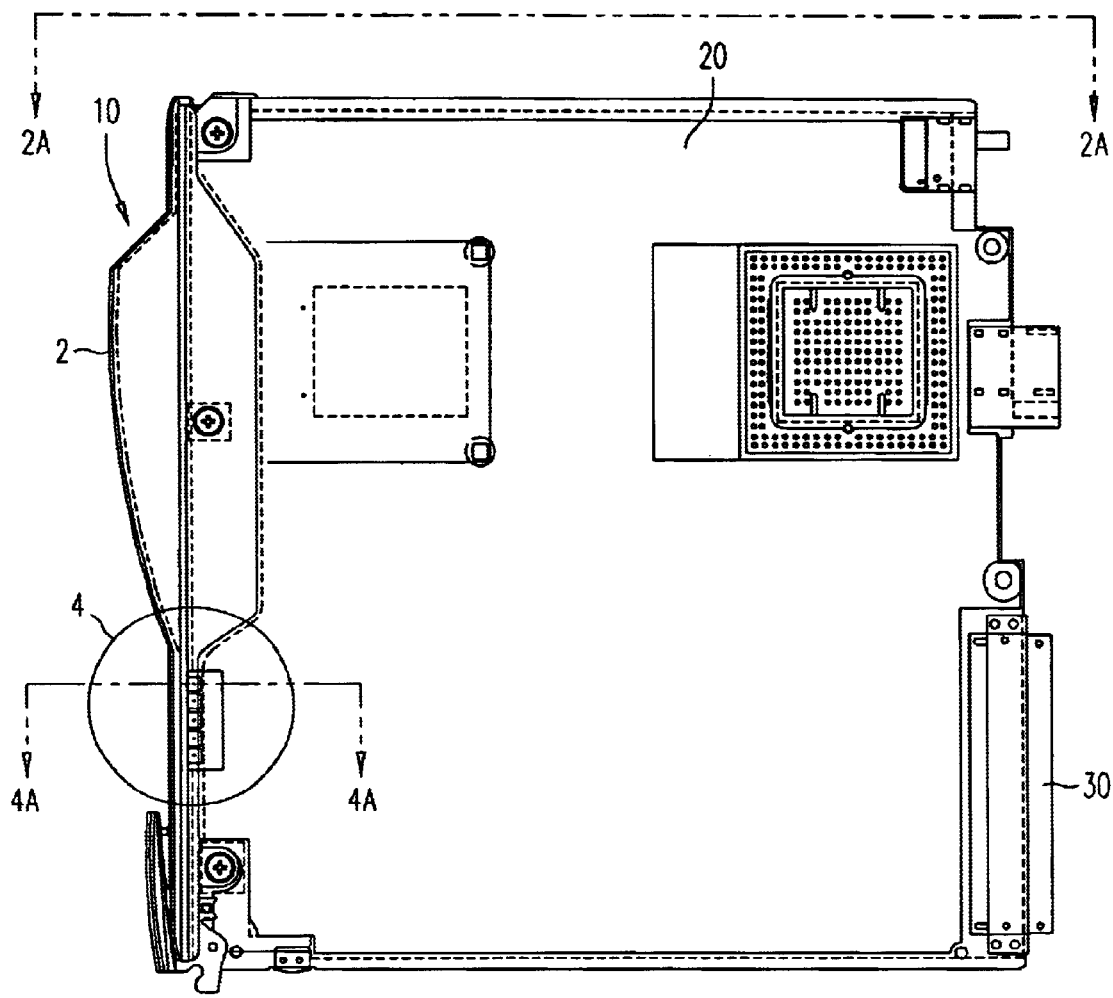
FIG. 1 is a side view of an integrated faceplate assembled to a printed circuit board, in accordance with an embodiment of the present invention.

The present invention is directed to an integrated faceplate that indicates the operation status of electronic equipment such as telecommunication equipment using one or more built-in light pipes. The integrated faceplate combines both a molded plastic bezel (also called "frame") and one or more light-pipes into a single piece, and the light-pipes of the faceplate indicate the operation status of the equipment by illumination with light sources placed opposite to light-pipes behind the faceplate.

For example, the light-pipes can indicate the operation status of telecommunication equipment, such as power on-off, operation failures, standby mode, synchronization of multiple fiber rings, and in-use status of particular circuits. For the light sources, LED (Light Emitting Diode), light bulb, fluorescent bulb, and electro-luminescent bulb can be used. Among these, LED is preferred because of its high light output or intensity, extremely long life (8–10 years in continuous use), low power consumption, and robustness.

As mentioned above, in the integrated faceplate of the present invention, two parts, namely faceplate bezel and light-pipe(s), are integrated into one piece. For example, the two parts are injection-molded in a single operation to form just one piece. A faceplate bezel of the type described herein may be similar to a conventional faceplate except for the integration. Integration as described herein simplifies the inventory control of the faceplate as well as the assembly of electronic equipment, by reducing the number of parts that are to be kept track of and assembled.

A light-pipe of one embodiment includes a lens and a light guide. A light source such as LED is disposed next to the lens, and the light from the light source pass through the lens and the light guide, so that the light-pipe illuminates to show a particular operation status of the equipment. The lens focuses the light from the light source toward the light guide so as to minimize the deviation of the light to the outside of the light guide. The light guide effectively focuses the light from the light source only at a desired area within the boundary of the light guide, so that the eyes of an operator can see the lighted surface at a wide viewing angle and distance.

This diffusion of the light can be achieved through any of a number of different techniques that modify the surface of the light guide (or light-pipe) as would be apparent to the skilled artisan in view of this disclosure, and three such techniques are as follows. First, by forming a texture on the part of the surface of the mold for the light-pipe of the faceplate, a number of lenses are created on the surface of the light guide and achieve the effective diffusion of the light. Secondly, the surface of the light guide can be formed as a diffusing lens, which is a custom lens designed for the effective light diffusion. The lens can be formed by using mold inserts in molding the faceplate. Thirdly, in order to form a diffusing lens, a formulated ink can be printed or silk screened onto the surface of the light guide.

Figure 2:
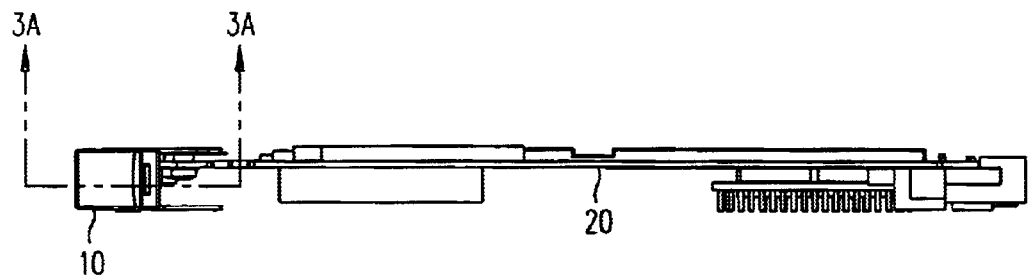
FIG. 2 is a top view of the structure of FIG. 1, in the direction 2A—2A.

In accordance with an embodiment of the present invention, FIGS. 1 and 2 are side and top views of an integrated faceplate 10 (also called simply "faceplate" in the following discussion) assembled to a printed circuit board 20. Faceplate 10 consists of a bezel 2 and a number of light-pipes 4, which are injection-molded into a single piece. Bezel 2 is a remaining part of faceplate 10 other than light-pipes 4.

Faceplate 10 is made of a clear plastic materials such as polycarbonate (lexan), SAN (ABS), or acrylic. The plastic material must be optically clear enough so as to not impair the transmissivity of light to a degree that the light emitting diode (LED) does not provide adequate illumination at the diffused lens to be noticeable in a brightly lit room (or in sunlight).

Although optically clear, the plastic material may be colored to enhance a particular color. For example, a red LED light source into a clear faceplate is the same effect as a white LED light source into a clear red-colored faceplate.

Faceplate 10 is connected to an edge of printed circuit board 20, on which electronic components are mounted. On another edge of printed circuit board 20 that is opposite to the edge to which faceplate 10 is connected, a connector 30 is connected for connecting to telecommunication equipment (not shown) when printed circuit board 20 is inserted into a slot of the telecommunication equipment. Thus, faceplate 10 is connected to printed circuit board 20 by a portion of bezel 2 or other mechanical means.

Figure 3:
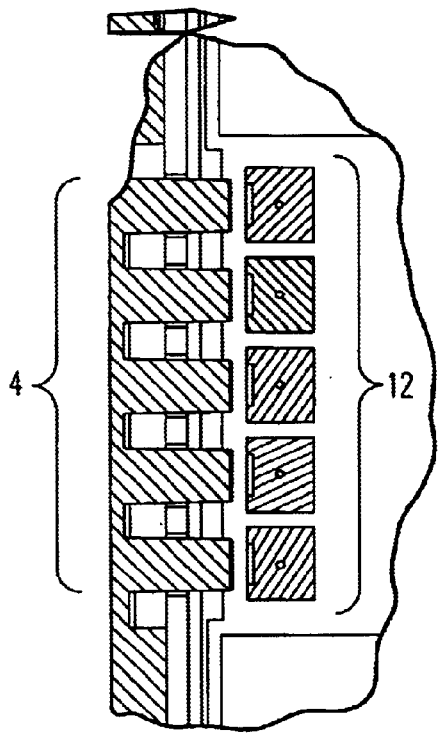
FIG. 3 is a vertical partial cross-sectional view of the single piece integrated faceplate of FIG. 2, in the direction 3A—3A.

FIG. 3 a vertical partial cross-sectional view of the single piece integrated faceplate of FIG. 2. A number of light sources 12 (such as LEDs) are located adjacent to the ends of the corresponding number of light-pipes 4. Moreover, light sources 12 are individually connected to (and mounted on) a printed circuit board 20 (FIG. 1), so as to react (on-and off) in response to a specific operation status of the telecommunication equipment.

Figure 4:
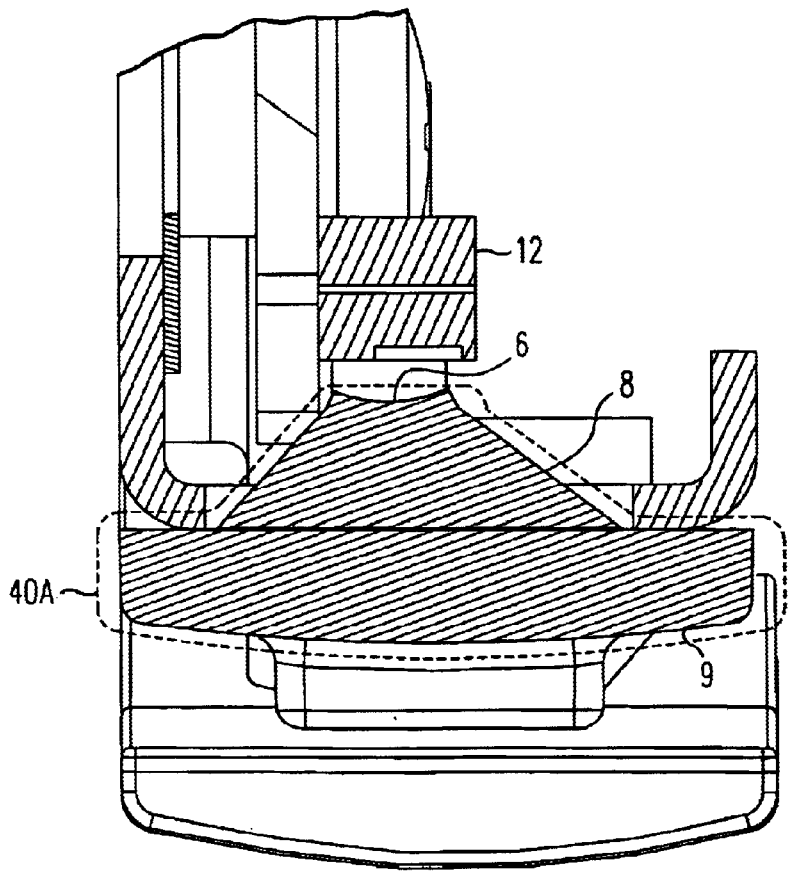
FIG. 4 is a horizontal cross-sectional view (rotated 90 degrees counterclockwise) of the single piece integrated faceplate of FIG. 1, through the upper-most light-pipe.

FIG. 4 is a horizontal cross-sectional view of the uppermost integrated light-pipe (which is individually labeled 40A in FIG. 4) of FIG. 1, in the direction 4A—4A. Light-pipe 40A is shown by a dashed line in FIG. 4 and includes a curved lens surface 6, a light guide 8 and another surface 9 (described below). The light from light source 12 passes through lens 6 and light guide 8, so that light-pipe 40A illuminates to show a particular operation status of the telecommunication equipment.

Lens 6 is shaped to focus the light from light source 12 towards light guide 8, so that the light may diffuse within the boundary of light guide 8, especially the thickness of each light guide 8. If the light from one light source 12 dissipates to the area of an adjacent light-pipe such as light pipe 40B (see FIGS. 5A and 5B) which does not correspond to the light source 12 (see FIG. 4), the operation status of the telecommunication equipment can be misread.

Lens 6 (FIG. 4) can be a Freznell, toroidal, or prescription lens. Light guide 8 effectively diffuses the light from light source 12 only at a desired area within the boundary of the light guide, so that the eyes of an operator can see the lighted surface at a wide viewing angle and distance.

The diffusion of light within light guide 8 can be, as mentioned above, achieved through three different techniques that modify a surface 9 of the light guide that is shown to the operator. The first technique is the formation of a number of mini refracting lenses (not shown) on surface 9 by texturizing the inner surface of the mold that forms surface 9. The mini refracting lenses achieve the effective diffusion of the light. The textured surface (finer is better) can be formed by Electrical Discharge Machining (EDM) or acid etch finishes such as a Mold-tech or SPI-SPE finishes (wherein SPE stands for Society of Plastics Engineers).

A second method is the formation of a diffusing lens on surface 9, which is a custom lens designed for the effective light diffusion. The lens can be formed by using mold inserts in molding the faceplate. In one embodiment, such an engineered lens uses a nickel substrate on which very tiny features (which form the lens surfaces) are grown in a tightly controlled electrochemical bath. The result is a microfiberous surface that diffuses light evenly. Finally, in order to form a diffusing lens, a formulated ink can be printed or silk screened onto surface 9 of the light guide 8. An exemplary formulated ink is a mixture of clear ink base, matte powder, and white ink.

As illustrated in FIGS. 5A and 5B, any number of light pipes 40A–40N (wherein $A \leq I \leq N$, N being the number of light pipes) may be integrated into a faceplate, and the faceplate is supported by and mounted on a printed circuit board, and the printed circuit board in turn is housed in an enclosure (such as a shelf or cabinet not shown in FIGS. 5A and 5B). The number N depends on the number of signals that need to be displayed to an operator in a region outside the just-described enclosure.

The invention has been described using exemplary embodiments. However, it is to be understood that the scope of the invention is not limited to the disclosed embodiments. On the contrary, it is intended to cover various modifications and similar arrangements. For example, a single piece integrated faceplate of the type described herein may be used without a printed circuit board, although a printed circuit board is shown in certain figures. The scope of the claims, therefore, should be accorded to the broadest interpretation so as to encompass all such modifications and similar arrangements.

What is claimed is:

1. A faceplate indicating operation status of an apparatus, comprising:

a bezel; and a light-pipe;

wherein the bezel and the light-pipe are integrated into one piece; and wherein the light-pipe comprises a lens and a light guide, wherein the lens focuses light from a light source towards the light guide; and wherein a surface of the light guide comprises a plurality of lenses to promote diffusion of the light.

2. A faceplate indicating operation status of an apparatus, comprising:

a bezel; and a light-pipe;

wherein the bezel and the light-pipe are integrated into one piece; and wherein the light-pipe comprises a lens and a light guide, wherein the lens focuses light from a light source towards the light guide; and wherein an ink is applied on a surface of the light guide to promote diffusion of the light.

3. A faceplate indicating operation status of an apparatus, comprising:

a bezel; and a light-pipe;

wherein the bezel and the light-pipe are integrated into one piece; and wherein the light-pipe comprises a lens and a light guide, wherein the lens focuses light from a light source towards the light guide; and wherein a diffusing lens is formed on a surface of the light guide to promote illumination of the light.

4. The faceplate of claim 1, wherein the faceplate comprises a plurality of light-pipes including said light-pipe.

5. The faceplate of claim 2 wherein the faceplate comprises a plurality of light-pipes including said light-pipe.

6. The faceplate of claim 3 wherein the faceplate comprises a plurality of light-pipes including said light-pipe.

7. An apparatus comprising:

a printed circuit board;

a plurality of light sources individually connected to and mounted on the printed circuit board so as to react on and off in response to a specific operation status of telecommunication equipment connected to the printed circuit board; and a faceplate connected to an edge of the printed circuit board, the faceplate comprising:

a bezel; and a plurality of light-pipes;

wherein the bezel and the plurality of light-pipes are integrated into one piece; and wherein each light-pipe in the plurality of light-pipes comprises a light guide and a lens, said lens focusing light from a light source in said plurality of light sources only on a predetermined area within a boundary of said light guide.

8. The apparatus of claim 7 further comprising means for diffusing formed on a surface of each light guide to promote illumination of the light incident thereon.

* * * * *